(12) United States Patent
Wada et al.

(10) Patent No.: US 7,705,520 B2
(45) Date of Patent: Apr. 27, 2010

(54) DRIVING DEVICE

(75) Inventors: Akira Wada, Osaka (JP); Yasuhiro Okamoto, Tondabayashi (JP); Taketo Namikawa, Kyoto (JP)

(73) Assignee: Konica Minolta Opto, Inc., Hachioji-shi (JP)

(*) Notice: Subject to any disclaimer, the term of this patent is extended or adjusted under 35 U.S.C. 154(b) by 91 days.

(21) Appl. No.: 11/890,564

(22) Filed: Aug. 7, 2007

(65) Prior Publication Data
US 2008/0315721 A1    Dec. 25, 2008

(30) Foreign Application Priority Data
Aug. 11, 2006    (JP)    ............... 2006-219254

(51) Int. Cl.
*H01L 41/04* (2006.01)
(52) U.S. Cl. ...................... 310/328; 310/345
(58) Field of Classification Search ................. 310/328, 310/345, 348, 351
See application file for complete search history.

(56) References Cited

U.S. PATENT DOCUMENTS 6,111,336 A * 8/2000 Yoshida et al. .............. 310/328

FOREIGN PATENT DOCUMENTS

| JP | 2003-069100 | * | 3/2003 |
| JP | 2003-69100 A | | 3/2003 |

OTHER PUBLICATIONS

Machine translation of JP2001-080070 from the Japanese Patent Office (2001).*
Machine translation of JP2003-069100 from the Japanese Patent Office (2003).*

* cited by examiner

*Primary Examiner*—Walter Benson
*Assistant Examiner*—Derek J Rosenau
(74) *Attorney, Agent, or Firm*—Sidley Austin LLP

(57) ABSTRACT

There is provided a driving device 1 in which an electromechanical transducer is used and which has a high drive efficiency, having an electromechanical transducer 4 that is extended and contracted by application thereto of voltages, a drive shaft 6 having one end fixed by adhesive 5 to the electromechanical transducer 4, and a movable member 7 that is frictionally engaged on the driving shaft 6, an expression $8 \geq E/t \geq 0.48$ where t (μm) is a thickness of the adhesive and E (GPa) is a modulus of longitudinal elasticity of the adhesive is satisfied by mixing into the adhesive 3, 5 particulates 10 that have diameters not smaller than 1 μm and not larger than 5 μm.

14 Claims, 4 Drawing Sheets

DRIVING DEVICE

RELATED APPLICATION

This application is based on application No. 2006-219254 filed in Japan, the contents of which are hereby incorporated by reference.

BACKGROUND OF THE INVENTION

The present invention relates to a driving device and more particularly relates to a driving device in which an electromechanical transducer is used.

There is publicly known a driving device in which one end of an electromechanical transducer such as piezoelectric element is fixed by adhesive to a fixed member such as weight, in which one end of a drive shaft is fixed by adhesive to the other end of the electromechanical transducer, and in which a movable member is frictionally engaged with the drive shaft. There is also publicly known a driving device in which one end of a drive shaft is fixed to a fixed end, in which an electromechanical transducer is fixed by adhesive to the other end of the drive shaft, and in which a movable member is frictionally engaged with the drive shaft. Upon application of asymmetric fluctuation voltages to electrodes of the electromechanical transducer in such a driving device, the electromechanical transducer oscillates at different velocities (accelerations) in an extending direction and in a contracting direction and the drive shaft reciprocates asymmetrically in an axial direction. When the drive shaft slowly moves, the movable member in friction engagement with the drive shaft moves with the drive shaft while keeping the friction engagement. When the drive shaft rapidly moves, the movable member tends to stay at the present position due to an inertial force exerting thereon and thereby slides relative to the drive shaft. With repetition of such an action, the driving device moves and positions the movable member.

In a process for manufacturing a conventional driving device, thicknesses of adhesive between the fixed member and the electromechanical transducer and between the electromechanical transducer and the drive shaft are controlled so as to be constant in general, by making constant a weight of the adhesive applied thereto and pressures exerted on the fixed member and the electromechanical transducer and on the electromechanical transducer and the drive shaft.

FIG. 5 shows a change in thickness of an adhesive layer with respect to pressure on occasion when a specified quantity of adhesive is applied onto the electromechanical transducer and when the drive shaft is pressed on the adhesive against the electromechanical transducer. It is quite difficult to strictly control the quantity of the applied adhesive and the pressure in an actual manufacturing process, and there occurs a great variation in the thicknesses of the adhesive layers of products.

In Japanese unexamined patent publication No. 2003-69100, it is described that the adhesive layer is controlled so as to have a desired thickness with glass particles having diameters between 5 and 50 µm mixed into the adhesive.

FIG. 6 shows a change in thickness of the layer of adhesive in which particulates are mixed, with respect to the pressure. As shown in the drawing, the thickness of the adhesive layer can be made the same as a diameter (td) of the mixed particulates by application of a pressure not smaller than a given magnitude (Fs).

Though the adhesive layer can be made to have a desired thickness with particulates mixed into adhesive in this manner, the device has a problem in that an efficiency of the drive is deteriorated because the resultant increase in the thickness of the adhesive layer causes the extension and contraction of the electromechanical transducer to be absorbed by an elasticity of the adhesive layer or because the elasticity of the adhesive layer causes a delay in transmission to the drive shaft.

SUMMARY OF THE INVENTION

In consideration of the problem, an object of the present invention is to provide a driving device in which an electromechanical transducer is used and which has a high drive efficiency.

In order to achieve the objects of the present invention, there is provided a driving device including an electromechanical transducer that is extended and contracted by application thereto of voltages, a drive shaft having one end fixed by adhesive to the electromechanical transducer, and a movable member that is frictionally engaged on the driving shaft, and fulfils an expression of $E/t \geqq 0.48$ where t (µm) is a thickness of the adhesive and E (GPa) is a modulus of longitudinal elasticity of the adhesive.

This configuration allows the adhesive layer to be thinned to such an extent that the elasticity of the adhesive layer does not cause the decrease in the drive efficiency while ensuring a thickness of the adhesive layer that is required for filling, with the adhesive, protrusion and depressions on a surface composed of gaps between PZT particles forming the electromechanical transducer. Thus the driving device of the invention has a high driving efficiency.

The driving device of the invention may fulfill an expression of $E/t \leqq 8$.

In this configuration, the adhesive layer has a thickness not less than 1 µm on condition that there is used epoxy adhesive having a modulus of longitudinal elasticity on the order of 8 GPa, which is presently the highest. Therefore, intermittence of the adhesive layer can be prevented and insulation between the electromechanical transducer and the drive shaft can be kept.

In the driving device of the invention, particulates may be mixed into the adhesive. The particulates preferably have diameters not smaller than 1 µm and not larger than 5 µm.

In this configuration, the adhesive layer can be formed so as to have a desired thickness, by means of the particulates mixed into the adhesive. PZT particles generally have diameters between 3 and 5 µm. Accordingly, the particulates having diameters not smaller than 1 µm are not fully buried in the gaps between the PZT particles and partially protrude from the surface of the electromechanical transducer. Thus a layer of the adhesive can be ensured between the electromechanical transducer and the drive shaft or the fixed member.

In the invention, as described above, the thickness of the adhesive layer between the electromechanical transducer and the drive shaft or the fixed member is optimized and a high drive efficiency is thereby achieved.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE PREFERRED EMBODIMENTS

Figure 1:
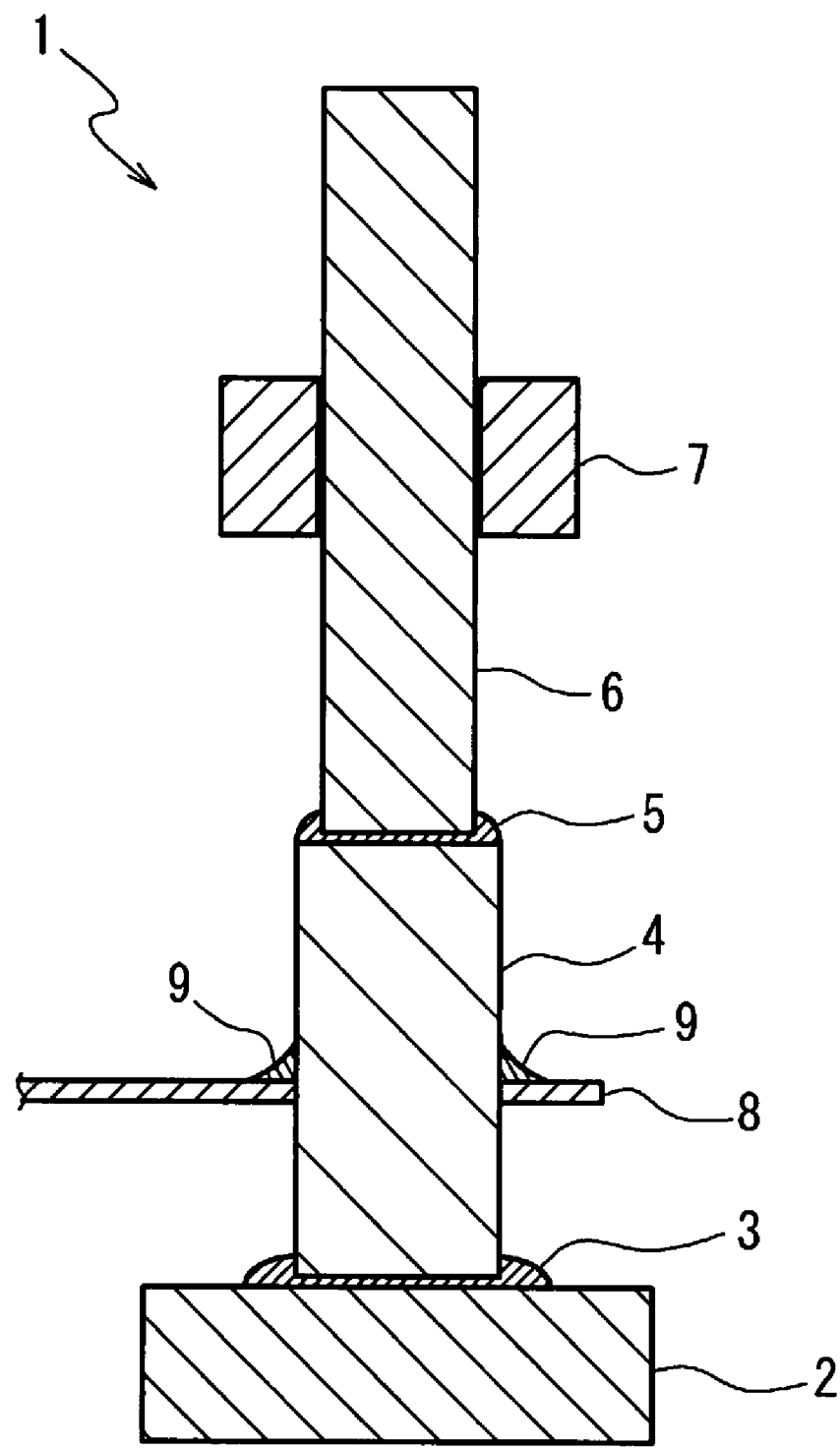
FIG. 1 is a sectional view of a driving device that is an embodiment of the invention.

FIG. 1 shows a driving device 1 that is an embodiment of the invention. The driving device 1 is composed of a fixed member 2 that is a weight, an electromechanical transducer 4 having one end fixed by adhesive 3 to the fixed member 2, a drive shaft 6 having one end fixed by adhesive 5 to the other end of the electromechanical transducer 4, and a movable member 7 engaged on the drive shaft 6 by a frictional force. A flexible substrate 8 is connected to the electromechanical transducer 4 by conductive adhesive 9 in order to apply fluctuation voltages to two electrodes of the electromechanical transducer 4.

As the electromechanical transducer 4, there can be used a piezoelectric transducer element of first to sixth embodiments disclosed in JP 2003-69100 A, i.e., the piezoelectric transducer element in which a sheet-like piezoelectric element having first electrode formed on one surface and second electrode formed on the other surfaces of the piezoelectric transducer element is folded double at a folding part generally in center of the element and is wound into a columnar shape centered on the folding part so as to be laminated, and a piezoelectric element in which sheet-like piezoelectric elements are laminated with a first electrode and a second electrode interposed alternately between the elements, or the like.

The electromechanical transducer 4 extends and contracts in accordance with the applied voltage and thereby reciprocates the drive shaft 6 in an axial direction. Velocities (accelerations) of the drive shaft 6 change in accordance with a waveform of the fluctuation voltages applied to the electromechanical transducer 4, and thus application of fluctuation voltages having an asymmetric waveform causes the drive shaft 6 to move at velocities different according to directions in which the shaft moves. When the drive shaft 6 slowly moves, the movable member 7 moves with the drive shaft 6 while keeping the friction engagement with the drive shaft 6. When the drive shaft 6 rapidly moves, the movable member 7 tends to stay at the present position due to an inertial force exerting thereon and thereby slides relative to the drive shaft 6. The movable member 7 is moved in an axial direction with repetition of such engaged movement and slide movement thereof relative to the drive shaft 6.

Figure 2:
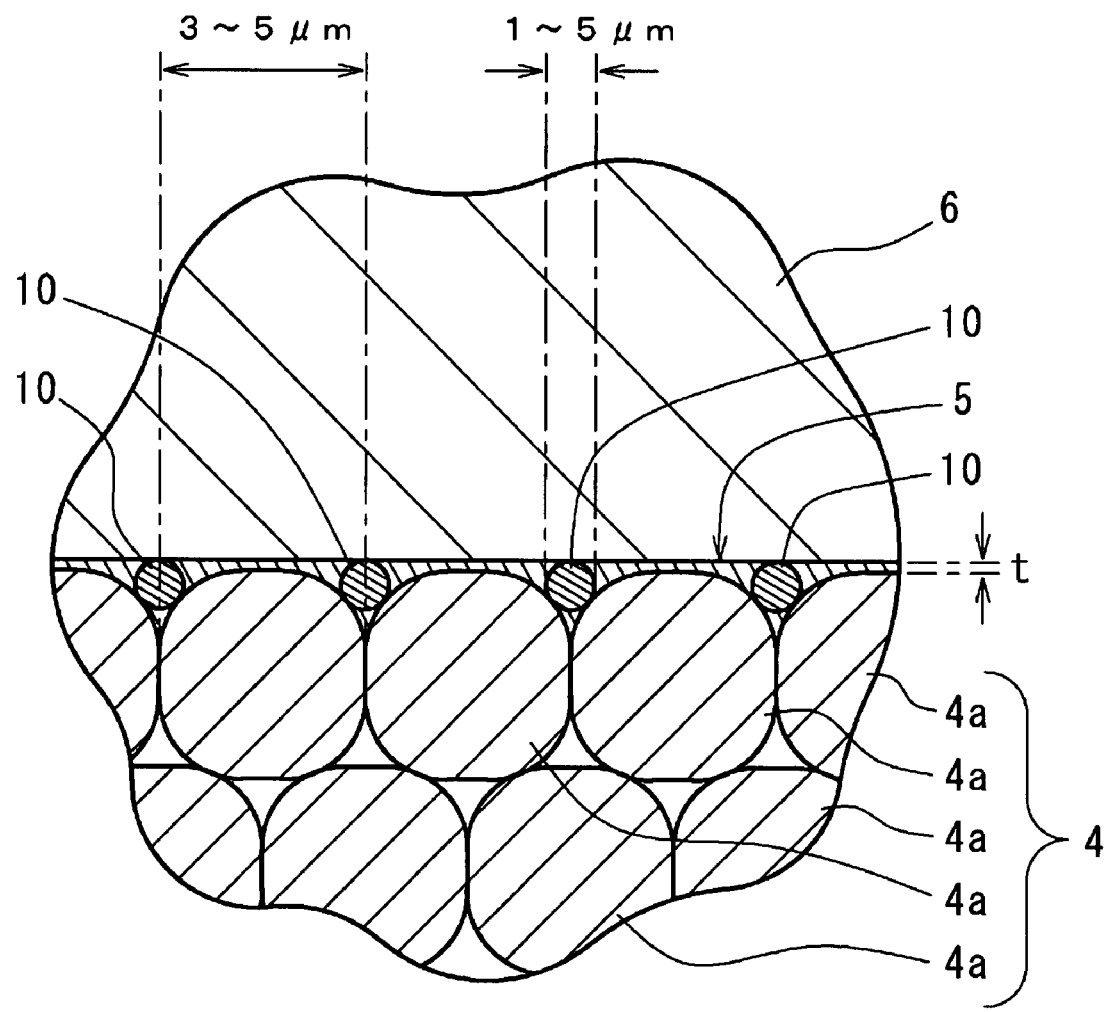
FIG. 2 is a detailed fragmentary section of the driving device of FIG. 1.

FIG. 2 shows detail of an adhesive layer of the adhesive 5 for fixation between the electromechanical transducer 4 and the drive shaft 6. The electromechanical transducer 4 is composed of a large number of PZT particles 4a that are shaped like potatoes with diameters around 3 to 5 μm by calcination of PZT powder having diameters around 0.5 μm and that are tightly arranged. On a surface of the electromechanical transducer 4 which surface is joined to the drive shaft 6, minute projections and depressions are formed according to the shapes of the PZT particles 4a.

As the adhesive 5, there is used insulating epoxy adhesive, for example, in which are mixed by volume 10% insulating particulates 10 with a diameter of 1 μm that are of resin such as divinylbenzene and acrylic or of inorganic material such as silica, for example. Herein, a thickness t of the adhesive layer of the adhesive 5 refers to a distance between the surface of the electromechanical transducer 4 and a joint surface of the drive shaft 6.

Hereinbelow will be described effects produced by mixing the particulates 10 into the adhesive 5.

In a process for manufacturing, the electromechanical transducer 4 is brought into press contact with the drive shaft 6 after application of the adhesive 5, and the particulates 10 then tend to escape from a pressure of the contact by entering gaps between the PZT particles 4a. Nevertheless, the particulates 10 having diameters not smaller than 1 μm are not fully buried in the gaps between the PZT particles 4a and protrude from the PZT particles 4a. Accordingly, the particulates 10 function as a spacer that keeps the thickness t of the adhesive layer between the electromechanical transducer 4 and the drive shaft 6 not smaller than a constant value as shown in the drawing by whatever large force the electromechanical transducer 4 is pressed against the drive shaft 6. Thus the electromechanical transducer 4 and the drive shaft 6 can firmly be fixed to each other without intermittence of the adhesive layer covering surfaces of the PZT particles 4a.

No intermittence of the adhesive layer of the adhesive 5 implies electrical insulation between the electromechanical transducer 4 and the drive shaft 6 and has an effect of preventing short circuit of the electromechanical transducer 4 even if the drive shaft is electrically conductive. The drive shaft 6 and/or the surface of the electromechanical transducer 4 which surface is joined to the drive shaft 6 may be nonconductive.

Figure 3:
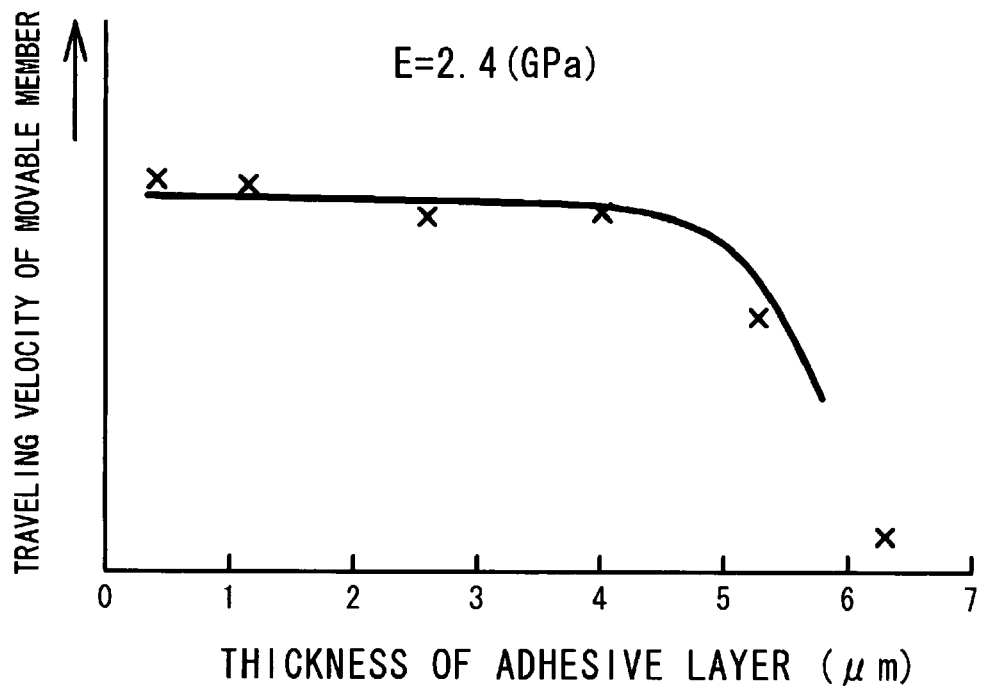
FIG. 3 is a graph showing a relation between thicknesses of an adhesive layer and traveling velocities of a movable member.
Figure 4:
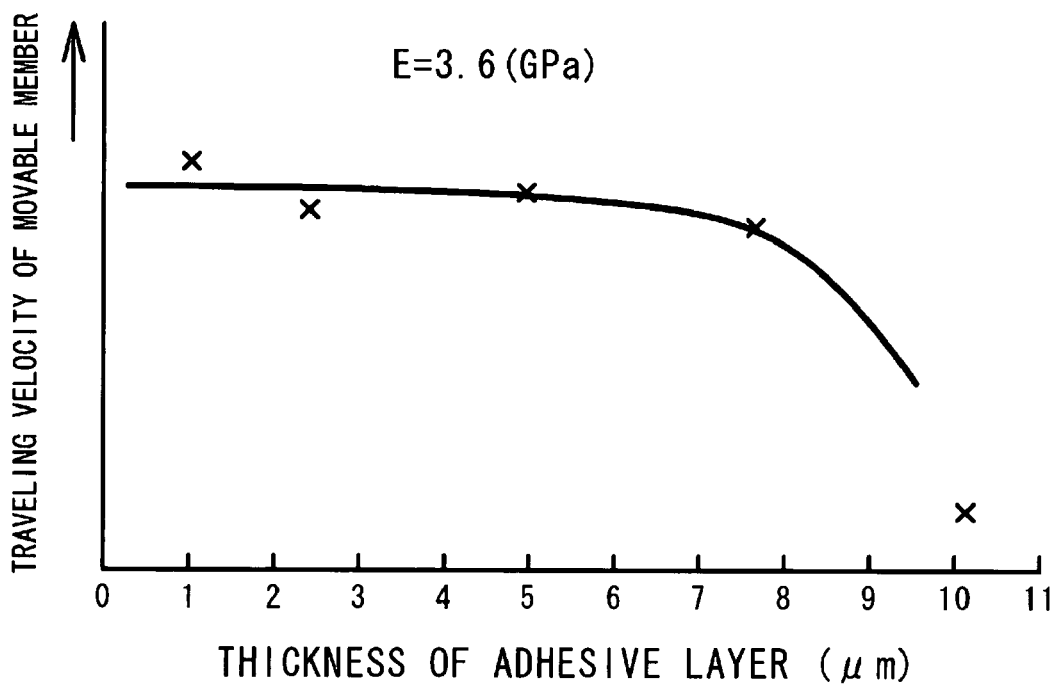
FIG. 4 is a graph showing a relation between thicknesses of an adhesive layer using different adhesive and the traveling velocities of the movable member.
Figure 5:
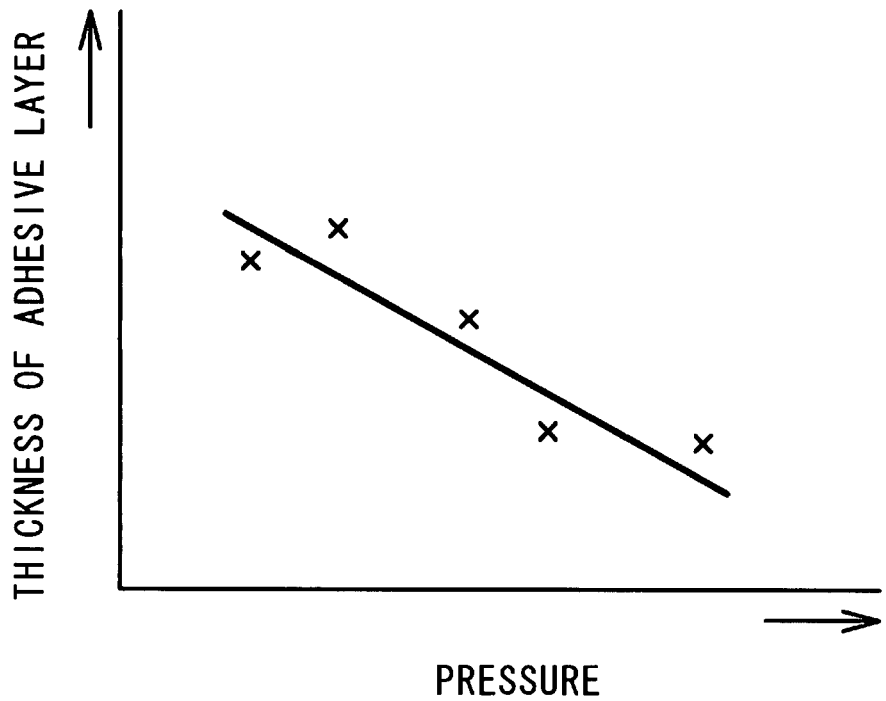
FIG. 5 is a graph showing a relation between pressures and thicknesses of an adhesive layer.
Figure 6:
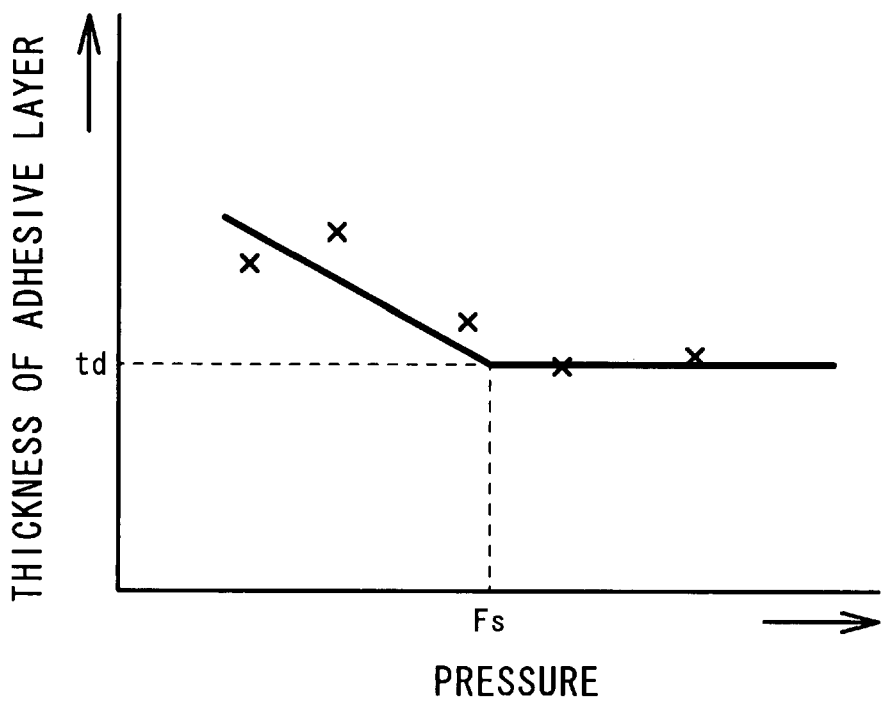
FIG. 6 is a graph showing a relation between pressures and thicknesses of an adhesive layer in which particulates are mixed into adhesive.

Relations between the thicknesses t of the adhesive layer of the adhesive 5 and the traveling velocities of the movable member 10 on condition that moduli of longitudinal elasticity E of the adhesive 5 are 2.4 GPa and 3.6 GPa are shown in FIG. 3 and FIG. 4, respectively. It is found in FIG. 3 (E=2.4 GPa) that the thicknesses t of the adhesive layer of about 5 μm or larger steeply decrease the traveling velocity of the movable member 7, that is, make it impossible to linearly transmit the extension and contraction of the electromechanical transducer 4 to the drive shaft 6. It is found in FIG. 4 (E=3.6 GPa) that the thicknesses t of the adhesive layer of about 7.5 μm or larger make it impossible to effectively drive the drive shaft 6. On basis of such experimental data, the inventors of the application have found that the traveling velocity of the movable member 7, that is, a drive efficiency of the driving device 1 decreases on condition of E/t<0.48.

The adhesive 5 preferably fulfils a condition of $8 \geq E/t \geq 0.48$, considering that some types of epoxy adhesive have a modulus of longitudinal elasticity of 8 GPa at maximum and that the thickness t of the adhesive layer should be of not less than 1μ, which is a minimum thickness preventing the film intermittence.

According to the condition, the thickness t of the adhesive layer may be 40 μm or smaller provided that the modulus of longitudinal elasticity E of the adhesive 5 is 2.4 GPa, for example. It is, however, not preferable to uselessly increase a required quantity of the adhesive 5 by mixture of such large particulates 10 that result in the thickness of the adhesive layer of 40 μm, and the diameters of the particulates 10 are preferably as large as those of the PZT particles 4a, i.e., on the order of 5 μm at the maximum.

It is needless to say that mixture of the particulates 10 into the adhesive 3 for a proper thickness t of the adhesive layer is effective also for adhesion between the electromechanical transducer 4 and the fixed member 2.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A driving device comprising an electromechanical transducer that is extended and contracted by application thereto of voltages, a drive shaft having one end fixed by adhesive to the electromechanical transducer, and a movable member that is frictionally engaged on the driving shaft, the driving device satisfying an expression of $E/t \geqq 0.48$ where $t(\mu m)$ is a thickness of the adhesive and $E(GPa)$ is a modulus of longitudinal elasticity of the adhesive.

2. A driving device as claimed in claim 1, the driving device further satisfying an expression of $E/t \leqq 8$.

3. A driving device as claimed in claim 2, wherein particulates are mixed into the adhesive.

4. A driving device as claimed in claim 3, wherein the particulates have diameters not smaller than 1 μm and not larger than 5 μm.

5. A driving device as claimed in claim 3, wherein the drive shaft is electrically conductive and wherein the adhesive and the particulates are electrically nonconductive.

6. A driving device as claimed in claim 1, wherein the movable member is moved relative to the drive shaft by application to the electromechanical transducer of voltages that produce a difference between velocities of extension and contraction of the electromechanical transducer.

7. A driving device comprising:
an electromechanical transducer of the type that extends and contracts upon application of voltage thereto,
a drive shaft having one end thereof fixed to the electromechanical transducer by an adhesive layer such that the drive shaft is moved in an axial direction thereof upon extension and contraction of the electromechanical transducer, and
a movable member that is frictionally engaged on the driving shaft,
wherein the adhesive layer satisfies the expression $E/t \geqq 0.48$ where
t is a thickness of the adhesive layer in μm, and
E is a modulus of longitudinal elasticity of the adhesive in GPa.

8. A driving device as claimed in claim 7, wherein the adhesive layer satisfies the expression of $0.48 \leqq E/t \leqq 8$.

9. A driving device as claimed in claim 8, wherein the adhesive layer includes electrically insulating spacer particles dispersed therein, a size of the spacer particles being not smaller than 1 μm and not larger than 5 μm.

10. A driving device as claimed in claim 9, wherein a material of the spacer particles is selected from the group consisting of a resin and an inorganic material.

11. A driving device as claimed in claim 10, wherein the spacer particles comprise 10% by volume of the adhesive layer.

12. A driving device as claimed in claim 10, wherein an adhesive of the adhesive layer comprises epoxy having a modulus of longitudinal elasticity of 2.4 GPa.

13. A driving device as claimed in claim 10, wherein an adhesive of the adhesive layer comprises epoxy having a modulus of longitudinal elasticity of 3.6 GPa.

14. A driving device as claimed in claim 10, wherein the draft shaft is electrically conductive and is electrically insulated from the electromechanical transducer.

\* \* \* \* \*